(12) United States Patent
Sun et al.

(10) Patent No.: US 10,784,895 B2
(45) Date of Patent: Sep. 22, 2020

(54) INTER-BLOCK MODIFICATIONS TO GENERATE SUB-MATRIX OF RATE COMPATIBLE PARITY CHECK MATRIX

(71) Applicant: Nokia Technologies Oy, Espoo (FI)

(72) Inventors: Jingyuan Sun, Beijing (CN); Deshan Miao, Beijing (CN); Yi Zhang, Beijing (CN); Keeth Saliya Jayasinghe, Piliyandala (LK)

(73) Assignee: Nokia Technologies Oy, Espoo (FI)

( * ) Notice: Subject to any disclaimer, the term of this patent is extended or adjusted under 35 U.S.C. 154(b) by 18 days.

(21) Appl. No.: 16/321,911

(22) PCT Filed: Aug. 8, 2016

(86) PCT No.: PCT/CN2016/094014
§ 371 (c)(1),
(2) Date: Jan. 30, 2019

(87) PCT Pub. No.: WO2018/027497
PCT Pub. Date: Feb. 15, 2018

(65) Prior Publication Data
US 2019/0181884 A1 Jun. 13, 2019

(51) Int. Cl.
*H03M 13/11* (2006.01)
*H03M 13/00* (2006.01)
*H04L 1/18* (2006.01)
*H03M 13/35* (2006.01)
*H04L 1/00* (2006.01)
*H04L 27/26* (2006.01)

(52) U.S. Cl.
CPC ...... *H03M 13/1185* (2013.01); *H03M 13/116* (2013.01); *H03M 13/353* (2013.01);
(Continued)

(58) Field of Classification Search
CPC ............. H03M 13/114; H03M 13/116; H03M 13/1111; H03M 13/1137; H03M 13/118;
(Continued)

(56) References Cited

U.S. PATENT DOCUMENTS 8,392,814 B2 * 3/2013 Lakkis ............. H03M 13/6393
714/804
RE46,692 E * 1/2018 Livshitz ............. H03M 13/1111
(Continued)

OTHER PUBLICATIONS

Matsumoto et al., "Rate-Compatibility and Incremental Redundancy HARQ for 802.16j LDPC Codes", IEEE 802.16 Presentation Submission Template (Rev. 8.3), IEEE S802.16j-06/183, Nov. 7, 2006, pp. 1-13.
(Continued)

*Primary Examiner* — Shelly A Chase
(74) *Attorney, Agent, or Firm* — Harrington & Smith

(57) ABSTRACT

A method includes accessing information, and at least one of encoding or decoding the information using a parity check matrix based on a coding rate. A portion of a data part in the parity check matrix has been generated based on part or all of another matrix. Apparatus, computer programs, and computer program products are also described. The apparatus may be a wireless mobile device or a wireless network access node. A communication system may include one or more of the wireless mobile devices and one or more of the access nodes, each using a version of the method.

20 Claims, 7 Drawing Sheets

(52) U.S. Cl.
CPC ..... *H03M 13/616* (2013.01); *H03M 13/6306* (2013.01); *H03M 13/6393* (2013.01); *H03M 13/6516* (2013.01); *H04L 1/0057* (2013.01); *H04L 1/0063* (2013.01); *H04L 1/0071* (2013.01); *H04L 1/1819* (2013.01); *H04L 27/2607* (2013.01)

(58) Field of Classification Search
CPC ......... H03M 13/6393; H03M 13/1185; H03M 13/353; H03M 13/616; G06F 3/0619; G06F 3/064; G06F 3/0679
See application file for complete search history.

(56) References Cited

U.S. PATENT DOCUMENTS

| | | |
|---|---|---|
| 2007/0067694 A1 | 3/2007 | Spencer |
| 2008/0256425 A1 | 10/2008 | Oh et al. |
| 2008/0294963 A1 | 11/2008 | Hwang |
| 2011/0022920 A1 | 1/2011 | Sharon et al. |
| 2017/0271718 A1* | 9/2017 | Jang .................... H03M 13/618 |
| 2018/0034476 A1* | 2/2018 | Kayser ................ G06F 16/951 |

OTHER PUBLICATIONS

Matsumoto et al., "Rate-Compatibility and Incremental Redundancy HARQ for 802.16j LDPC Codes", IEEE 802.16 Presentation Submission Template (Rev. 8.3), IEEE S802.16j-07/121r2, Jan. 15, 2007, pp. 1-15.

Rastovac et al., "The Design of Rate-Compatible LDPC Codes for IR-HARQ Systems over Erasure Channels", IEEE International Conference on Communications, May 23-27, 2010, 5 pages.

International Search Report and Written Opinion received for corresponding Patent Cooperation Treaty Application No. PCT/CN2016/094014, dated Apr. 28, 2017, 12 pages.

* cited by examiner

US 10,784,895 B2

INTER-BLOCK MODIFICATIONS TO GENERATE SUB-MATRIX OF RATE COMPATIBLE PARITY CHECK MATRIX

RELATED APPLICATION

This application was originally filed as PCT Application No. PCT/CN2016/094014, filed on 8 Aug. 2016.

TECHNICAL FIELD

This invention relates generally to wireless communications and, more specifically, relates to error correction codes on the wireless communications.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below, after the main part of the detailed description section.

There are many different error correction codes used in wireless communication. Such codes allow certain types of errors to be corrected during decoding of received information.

Low Density Parity Check (LDPC) is a type of error correction code, which is already used in 802.11n, 802.16e, and many other standards. Recently, LDPC has been received more attention as a promising coding scheme to fulfill next generation (i.e., 5G) mobile radio requirements.

In particular, in 5G, an efficient HARQ scheme is needed to guarantee high spectrum efficiency. Incremental redundancy (IR) is one type of HARQ, providing higher spectrum efficiency than chase combined (CC) HARQ. A rate compatible LDPC scheme is required to support IR HARQ.

BRIEF SUMMARY

This section is intended to include examples and is not intended to be limiting.

An exemplary embodiment is a method. The method includes accessing information, and at least one of encoding or decoding the information using a parity check matrix based on a coding rate, wherein a portion of a data part in the parity check matrix has been generated based on part or all of another matrix.

An additional exemplary embodiment includes a computer program, comprising code for performing the method of the previous paragraph, when the computer program is run on a processor. The computer program according to this paragraph, wherein the computer program is a computer program product comprising a computer-readable medium bearing computer program code embodied therein for use with a computer.

An exemplary apparatus includes one or more processors and one or more memories including computer program code. The one or more memories and the computer program code are configured to, with the one or more processors, cause the apparatus to perform at least the following: accessing information; and at least one of encoding or decoding the information using a parity check matrix based on a coding rate, wherein a portion of a data part in the parity check matrix has been generated based on part or all of another matrix.

An exemplary computer program product includes a computer-readable storage medium bearing computer program code embodied therein for use with a computer. The computer program code includes: code for accessing information; and code for at least one of encoding or decoding the information using a parity check matrix based on a coding rate, wherein a portion of a data part in the parity check matrix has been generated based on part or all of another matrix.

In another exemplary embodiment, an apparatus comprises means for accessing information, and means for at least one of encoding or decoding the information using a parity check matrix based on a coding rate, wherein a portion of a data part in the parity check matrix has been generated based on part or all of another matrix.

A wireless mobile device may comprise the apparatus described above. A wireless network access node may also comprise the apparatus described above. A communication system may comprise at least one a wireless mobile device according to the above and at least one a wireless network access node according to the above. For instance, a wireless mobile device could uses one version of the method to encode data, while a wireless network access node uses another version of the method to decode the data previously encoded and transmitted from the wireless mobile device to the wireless network access node.

DETAILED DESCRIPTION OF THE DRAWINGS

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The following disclosure is divided into sections for ease of reference.

Possible System

The exemplary embodiments herein describe techniques for error correction. Additional description of these techniques is presented after a system into which the exemplary embodiments may be used is described.

Figure 1:
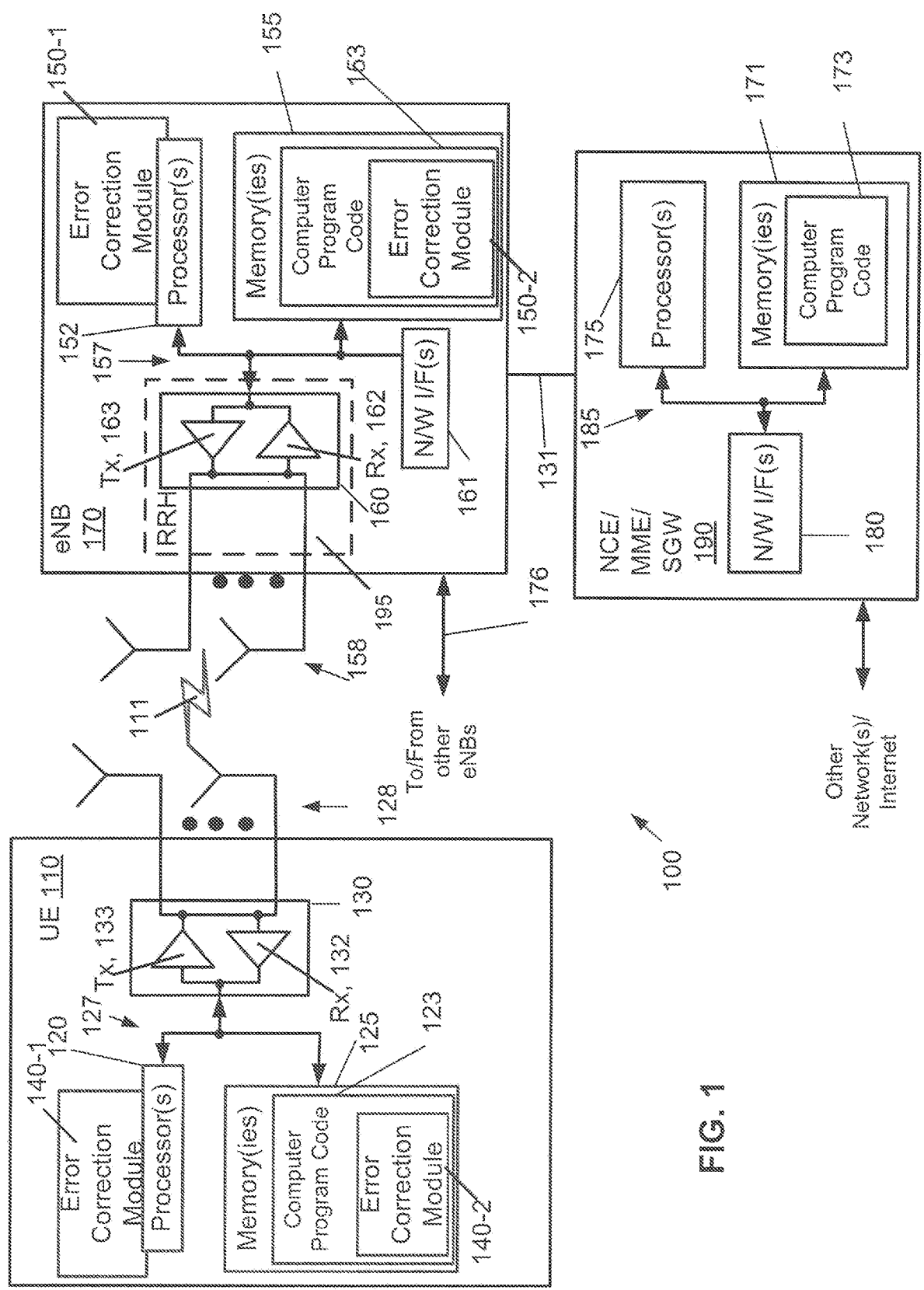
FIG. 1 is a block diagram of one possible and non-limiting exemplary system in which the exemplary embodiments may be practiced.

Turning to FIG. 1, this figure shows a block diagram of one possible and non-limiting exemplary system in which the exemplary embodiments may be practiced. In FIG. 1, a user equipment (UE) 110 is in wireless communication with a wireless network 100. A UE is a wireless, typically mobile device that can access a wireless network. The UE 110 includes one or more processors 120, one or more memories 125, and one or more transceivers 130 interconnected through one or more buses 127. Each of the one or more transceivers 130 includes a receiver, Rx, 132 and a transmitter, Tx, 133. The one or more buses 127 may be address, data, or control buses, and may include any interconnection mechanism, such as a series of lines on a motherboard or integrated circuit, fiber optics or other optical communication equipment, and the like. The one or more transceivers 130 are connected to one or more antennas 128. The one or more memories 125 include computer program code 123. The UE 110 includes an error correction module 140, comprising one of or both parts 140-1 and/or 140-2, which may be implemented in a number of ways. The error correction module 140 may be implemented in hardware as error correction module 140-1, such as being implemented as part of the one or more processors 120. The error correction module 140-1 may be implemented also as an integrated circuit or through other hardware such as a programmable gate array. In another example, the error correction module 140 may be implemented as error correction module 140-2, which is implemented as computer program code 123 and is executed by the one or more processors 120. For instance, the one or more memories 125 and the computer program code 123 may be configured to, with the one or more processors 120, cause the user equipment 110 to perform one or more of the operations as described herein. The UE 110 communicates with eNB 170 via a wireless link 111.

The eNB (evolved NodeB) 170 is a base station (e.g., for LTE, long term evolution) that provides access by wireless devices such as the UE 110 to the wireless network 100. The eNB 170 includes one or more processors 152, one or more memories 155, one or more network interfaces (N/W I/F(s)) 161, and one or more transceivers 160 interconnected through one or more buses 157. Each of the one or more transceivers 160 includes a receiver, Rx, 162 and a transmitter, Tx, 163. The one or more transceivers 160 are connected to one or more antennas 158. The one or more memories 155 include computer program code 153. The eNB 170 includes an error correction module 150, comprising one of or both parts 150-1 and/or 150-2, which may be implemented in a number of ways. The error correction module 150 may be implemented in hardware as error correction module 150-1, such as being implemented as part of the one or more processors 152. The error correction module 150-1 may be implemented also as an integrated circuit or through other hardware such as a programmable gate array. In another example, the error correction module 150 may be implemented as error correction module 150-2, which is implemented as computer program code 153 and is executed by the one or more processors 152. For instance, the one or more memories 155 and the computer program code 153 are configured to, with the one or more processors 152, cause the eNB 170 to perform one or more of the operations as described herein. The one or more network interfaces 161 communicate over a network such as via the links 176 and 131. Two or more eNBs 170 communicate using, e.g., link 176. The link 176 may be wired or wireless or both and may implement, e.g., an X2 interface.

The one or more buses 157 may be address, data, or control buses, and may include any interconnection mechanism, such as a series of lines on a motherboard or integrated circuit, fiber optics or other optical communication equipment, wireless channels, and the like. For example, the one or more transceivers 160 may be implemented as a remote radio head (RRH) 195, with the other elements of the eNB 170 being physically in a different location from the RRH, and the one or more buses 157 could be implemented in part as fiber optic cable to connect the other elements of the eNB 170 to the RRH 195.

The wireless network 100 may include a network control element (NCE) 190 that may include MME (Mobility Management Entity)/SGW (Serving Gateway) functionality, and which provides connectivity with a further network, such as a telephone network and/or a data communications network (e.g., the Internet). The eNB 170 is coupled via a link 131 to the NCE 190. The link 131 may be implemented as, e.g., an S1 interface. The NCE 190 includes one or more processors 175, one or more memories 171, and one or more network interfaces (N/W I/F(s)) 180, interconnected through one or more buses 185. The one or more memories 171 include computer program code 173. The one or more memories 171 and the computer program code 173 are configured to, with the one or more processors 175, cause the NCE 190 to perform one or more operations.

The computer readable memories 125, 155, and 171 may be of any type suitable to the local technical environment and may be implemented using any suitable data storage technology, such as semiconductor based memory devices, flash memory, magnetic memory devices and systems, optical memory devices and systems, fixed memory and removable memory. The computer readable memories 125, 155, and 171 may be means for performing storage functions. The processors 120, 152, and 175 may be of any type suitable to the local technical environment, and may include one or more of general purpose computers, special purpose computers, microprocessors, digital signal processors (DSPs) and processors based on a multi-core processor architecture, as non-limiting examples. The processors 120, 152, and 175 may be means for performing functions, such as controlling the UE 110, eNB 170, and other functions as described herein.

In general, the various embodiments of the user equipment 110 can include, but are not limited to, cellular telephones such as smart phones, tablets, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, tablets with wireless communication capabilities, as well as portable units or terminals that incorporate combinations of such functions.

Overview

Having thus introduced one suitable but non-limiting technical context for the practice of the exemplary embodiments of this invention, the exemplary embodiments will now be described with greater specificity.

As described above, in 5G, an efficient HARQ scheme is needed to guarantee high spectrum efficiency. Incremental redundancy (IR) is one type of HARQ, providing higher spectrum efficiency than chase combined (CC) HARQ. Rate compatible LDPC scheme is required to support IR HARQ. This disclosure focuses on generating rate-compatible PCM, where the PCM for a higher code rate is one part of the PCM for a lower code rate.

As an introduction, details of LDPC are more often discussed in association with the parity check matrix (PCM), which is used for encoding and decoding. Among different variants of LDPC, quasi-cyclic (QC) LDPC considers as the most practical way of using LDPC codes in realistic situations. In QC-LDPC, the PCM can be generated by expanding a base matrix based on the expansion factor Z, where the base matrix can be defined as the following:

$$\text{Base matrix} = \begin{bmatrix} P_{1,1} & P_{1,2} & P_{1,3} & \ldots & P_{1,N} \\ P_{2,1} & P_{2,2} & P_{2,3} & \ldots & P_{2,N} \\ \ldots & \ldots & \ldots & \ldots & \ldots \\ P_{M,1} & P_{M,2} & P_{M,3} & \ldots & P_{M,N} \end{bmatrix},$$

where $P_{i,j}$ equals $-1$ or a non-negative value, $i=1, 2, \ldots M$ and $j=1, 2, \ldots N$.

When generating the PCM, the following is performed:

1) if $P_{i,j}=-1$, it will be replaced by an all-zero matrix with size $Z*Z$;

2) if $P_{i,j}$ is a non-negative value, it will be replaced by cyclic-permutations of the identity matrix with size $Z*Z$, where the cyclic-permutation is based on the value of the $P_{i,j}$, e.g., if $P_{i,j}=5$, $Z=8$, then the cyclic-permutations of the identity matrix will be as following:

| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |

Considering a corresponding Tanner graph of the PCM, constructions should satisfy some PCM criteria, e.g., avoid length four circles or keep a low ratio of length four circles or keep a good girth profile with low ratio of small (e.g., four, six) circles in the Tanner graph. Otherwise, the performance of the LDPC coding scheme has been found to be not that good. For example, the PEG method can be used to generate the PCM that guarantees the aforementioned requirements. As is known, the girth g of the code is the length of the shortest circle in its Tanner graph. The girth profile is the profile of the length of the circle in its Tanner graph.

Figure 2:
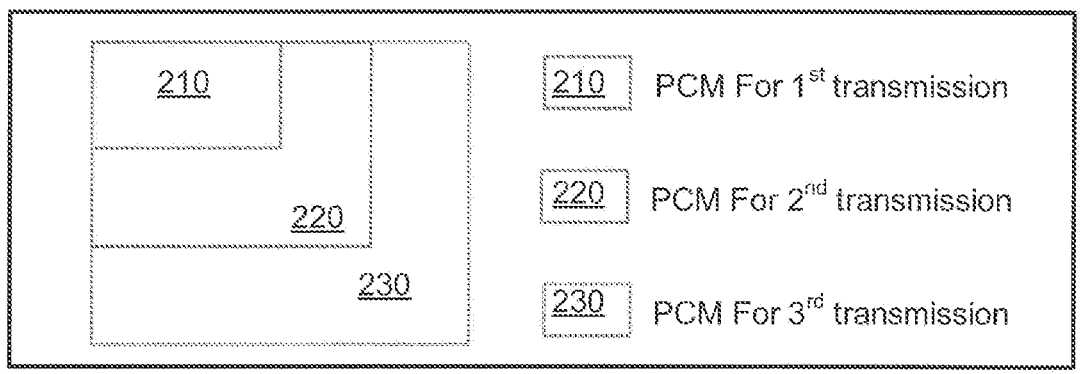
FIG. 2 illustrates an example illustrating it is possible to accomplish rate requirements with LDPC by having a single PCM as shown for rate-compatible PCM.

In the context of IR HARQ with LDPC codes, the earlier (e.g., first) transmission often has a higher code rate than the later (e.g., second) transmission (i.e., a retransmission). It is possible to accomplish such rate requirements with LDPC by having a single PCM as shown in FIG. 2. The first transmission which is relevant to the higher code rate PCM can be decoded at the receiver by using the matching PCM. This is illustrated by reference 210, the PCM for the first ($1^{st}$) transmission. When more information is available during the second transmission (see reference 220, the PCM for the second ($2^{nd}$) transmission), the lower data rate PCM can be used for decoding. Similarly, reference 230 indicated the PCM for the third ($3^{rd}$) transmission (i.e., another retransmission). However, designing such a base matrix which is capable of providing good performance with simple implementations is very important when supporting IR HARQ with LDPC.

One way to design such rate compatible PCM is to optimize the PCM for the first transmission (i.e., a higher code rate), then generate an extended part of the PCM for the second transmission such that the PCM for the second transmission with IR HARQ is based on the PCM for the first transmission with an extended part, and so on. That is, the PCM for the second transmission contains the PCM for the first transmission and the extended part, but the PCM for the first transmission and the extended part are independently generated. With such a design, as independently generated, the extended part of PCM for the second transmission and the PCM for the first transmission are generated independently, so these are totally different.

The progressive edge growth (PEG) algorithm can also be used to generate a PCM for the first transmission and the extended part. However, such approaches have higher implementation complexities and hardware throughputs can be very low. Overall, generating a rate compatible PCM to fulfill requirements of the new radios being proposed is an issue.

For instance, a new PCM can be generated as in Wataru Matsumoto, et al., IEEE 5802.16 j-06/183, "Rate-Compatibility and Incremental Redundancy HARQ for 802.16j LDPC codes" (2006-11-07). In this example the PCM is expanded from a rate compatible base matrix that is generated from the original base matrix, where the rate compatible base matrix is as follows:

$$\text{Base\_Matrix\_New} = \begin{bmatrix} D_{base} & P_{base} & 0_{base} \\ A_{base} & I_{base} & I_{base} \end{bmatrix},$$

Figure 3:
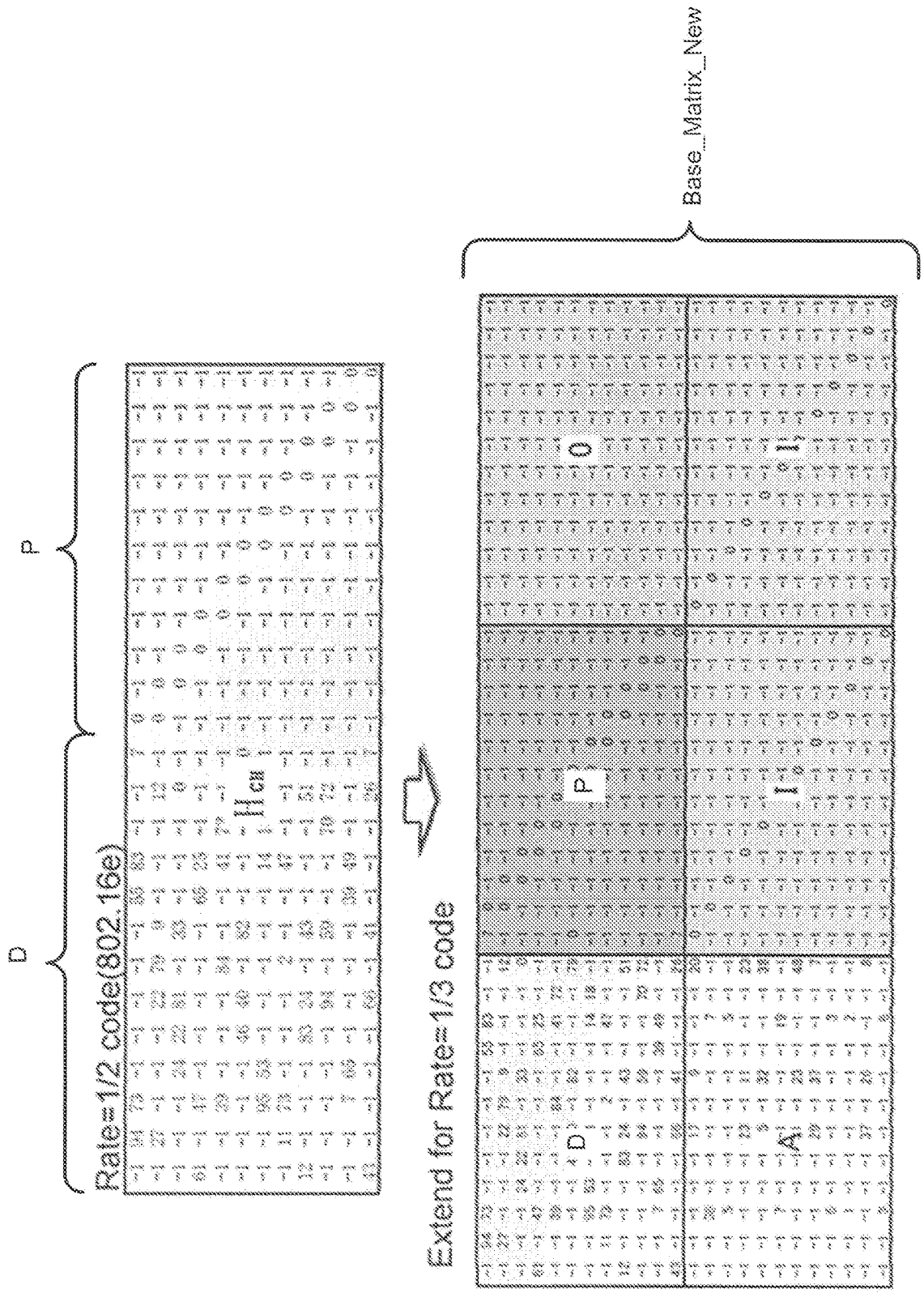
FIG. 3 illustrates an example structure of a base matrix of a PCM for rate compatible QC-LDPC.

Here, $D_{base}, P_{base}, A_{base}, I_{base}, 0_{base}$ represent the D, P, A, I, 0 in the figure, and matrices $D_{base}$ and $A_{base}$ are independently generated. For example, the matrix A could be generated by PEG algorithm. FIG. 3 illustrates structures of base matrices for rate compatible QC-LDPC, where these apply to IEEE 802.16e LDPC codes. In FIG. 3, the original base matrix $H_{CH}=[D_{base}\ P_{base}]$ (where D corresponds to "data" and P to "parity") is for rate=½ code for IEEE 802.16e, and Base_matrix_New has been extended from $H_{CH}$ for rate=1/3 code.

The exemplary embodiments herein propose new methods of generating rate compatible PCM with flexible designs, which are suitable to use with any existing, possibly optimized, PCM and has simpler implementation complexity. In particular, a PCM proposed herein contains several component matrices and inter-block shift/interleaves of a main component (e.g., a base matrix), or some existing PCM, is used to generate at least one component(s) of the PCM. Here, block means columns in the PCM corresponding to the same column in the corresponding base matrix.

The proposed rate compatible PCM design is described as follows. The following is a brief outline of certain exemplary embodiments:

1. A single PCM is used to support multiple code rates.
2. The PCM has several components, where some component matrices are generated using other component matrices (or the corresponding part in base matrix) or component matrices of existing (e.g., 802.11n, 802.11ad, and the like) PCM (or base matrix of such existing PCM).
3. The main component (e.g., one portion of the data part) of the PCM is designed for the highest code rate.
4. Component matrices can be generated by modifications such as inter-block cyclic shifts and/or interleaving of certain parts of the main component or other components of the PCM (e.g., some existing PCM) or a corresponding part in a base matrix, where the cyclic shifts and/or interleaving can be based on searching per predefined granularity until good performance is (are) found, where the granularity can be block or bit-group of the data part in the PCM.
5. Modifications such as inter-block shifts and/or interleaving are/is performed to avoid small (e.g., four) cycles or to keep a low ratio of small cycles or keep a good girth profile with low ratio of small (e.g., four, six) cycles in the Tanner graph.
6. The generated component may be sparsed to reduce the complexity of decoding.

The following description contains a number of exemplary and non-limiting embodiments based on this exemplary design. It is noted these are not the only embodiments that are possible, and also these embodiments may be combined if the combination is possible.

Embodiment 1

In this exemplary embodiment, the PCM is defined with several components as the following:

$$\begin{bmatrix} D & P & 0 \\ A & 0 & I \end{bmatrix},$$

where the part A can be an inter-block (e.g., granularity as block) cyclic shift of one existing PCM, and the block corresponds to a column of the base matrix for the existing PCM. For example, A can be generated by column cyclic shift of D, and D is referred to as one data part of the PCM in this example.

Figure 4A:
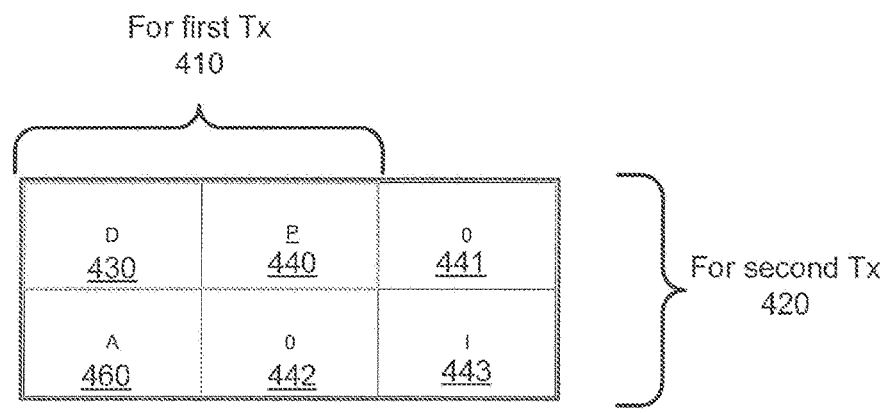
FIG. 4A illustrates a structure for a PCM for multiple transmissions in an example.
Figure 4B:
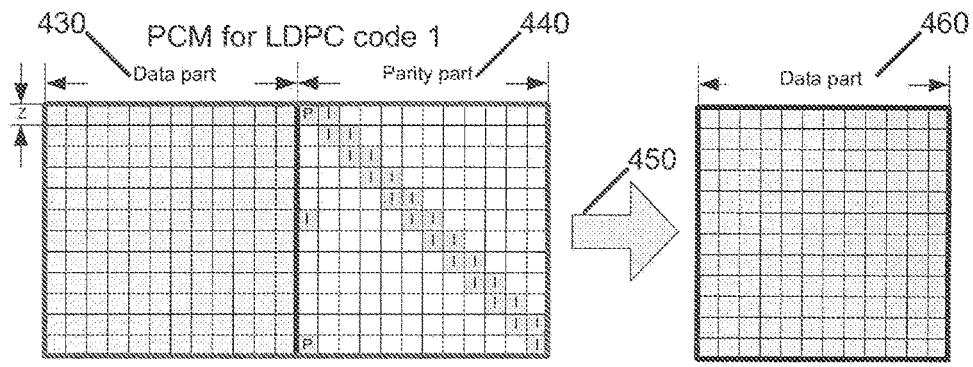
FIG. 4B represents generation of the part A for FIG. 4A in a general embodiment.
Figure 4C:
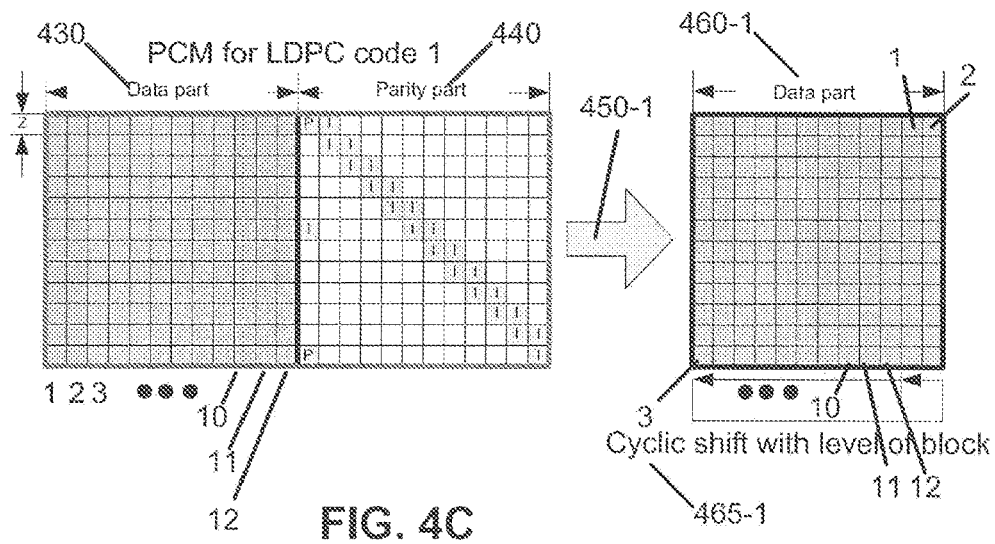
FIG. 4C illustrates generation of the part A for FIG. 4A in another exemplary embodiment.
Figure 5:
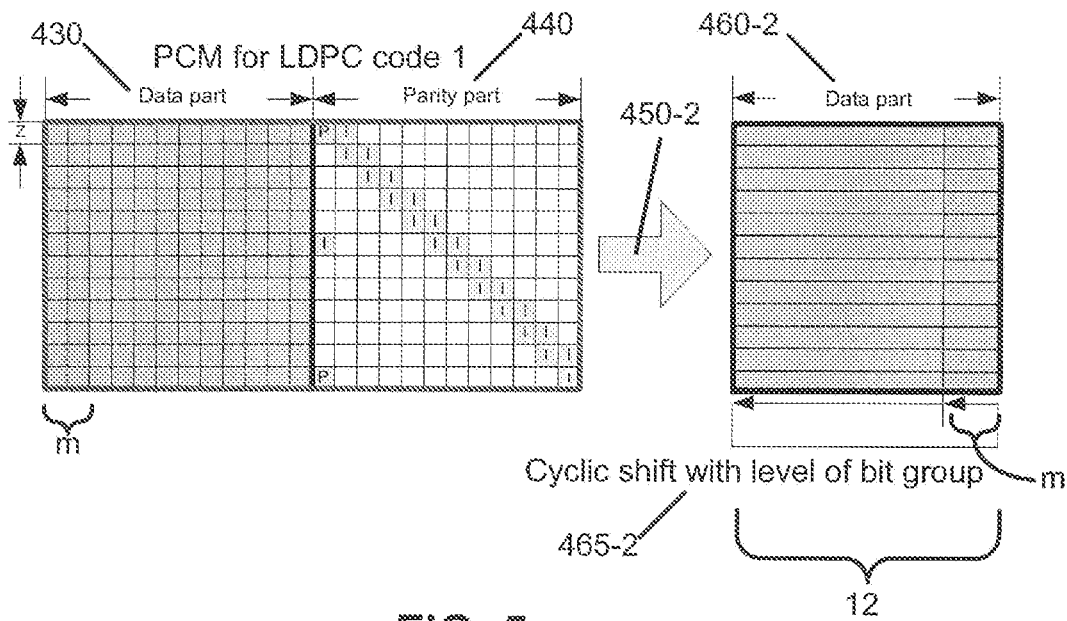
FIG. 5 illustrates a structure of PCM for rate compatible QC-LDPC with inter-block cyclic shift with granularity as bit-group.
Figure 6:
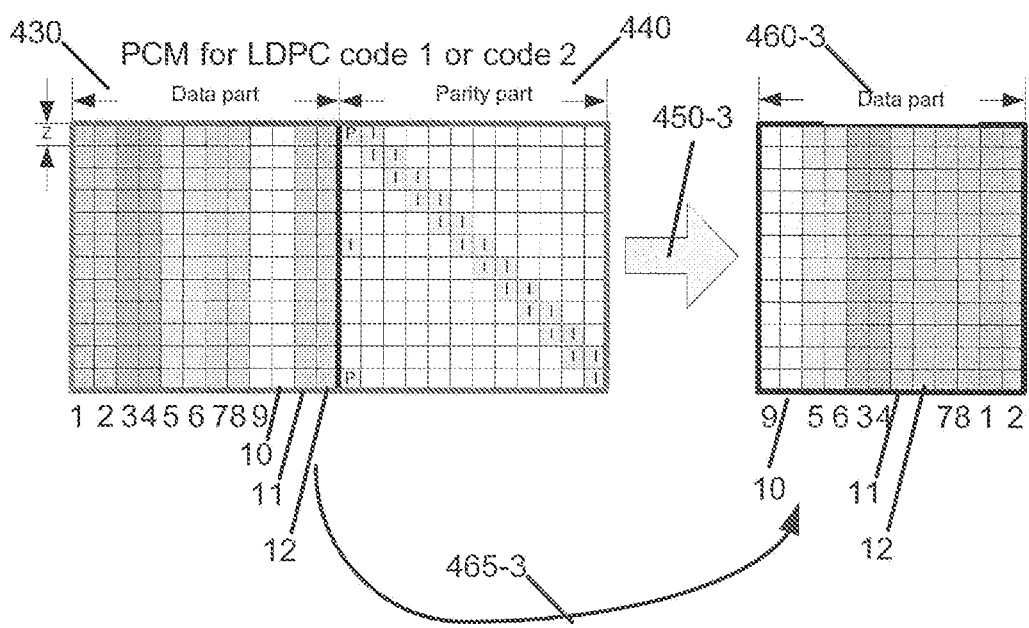
FIG. 6 illustrates a structure of PCM for rate compatible QC-LDPC with inter-block interleaving.

Turning to FIG. 4A, this figure illustrates a structure for a PCM for a second coding rate used for a second Tx in an example. The part 410 (for a first coding rate) includes parts D 430 and P 440 (which form a base matrix that is extended to form the part 420). The part 420 (a PCM) includes part 410 and parts 0 441, A 460, 0 442, and I 443, where 0 is a matrix of zeros and I is the identity matrix. FIG. 4B represents generation 450 of the part A in a general embodiment. In particular, the data part D 430 (for one coding rate) is modified through techniques such as cyclic shifts or interleaving to create the data part A 460 (used for another coding rate). FIGS. 4C, 5, and 6 provide examples of different techniques for modifying the data part D 430 to create the data part A 460. In FIGS. 4B, 4C, 5 and 6, the Z in these figures is the expansion factor, described above. It is also noted that a data part for a parity check matrix includes a portion (e.g., some or all) of the matrices D and A, but may also include other matrix(es) (or portions thereof), such as part of the extension portion for a third transmission.

FIG. 4C illustrates the generation (as illustrated by arrow 450-1) of part A 460 based on the modification 465-1 of the cyclic shift with the level of blocks. Specifically, the data part 430 includes 12 columns (with units as blocks, i.e., each of the 12 columns is a block) 1 through 12. The part A 430 results from cyclic shifting the columns 1 through 12 each to the left by two columns.

The modification 465 (e.g., cyclic shifts and/or interleaving) can be based on searching per one or several predefined granularity/granularities until the PCM criteria mentioned above are satisfied and rate compatible PCM with good performance is (are) found, where the granularity can be block or bit-group of the data part in the existing PCM.

In detail, the searching can be based on any one of the following schemes.

A) Searching per one granularity or several granularities. Based on this scheme, only relative location of the columns will be changed for the base matrix and the rate compatible PCM, without any disruption of the optimized property for the girth profile for the component.

B) Searching to guarantee the variance of column weight (degrees of variable nodes) of the base matrix or PCM is not large (e.g., not larger or lower than a threshold), i.e., based on modifications such as cyclic shift/interleaving in the searching result, the generated base matrix or PCM should not have a large variance of column weight.
1) A largest column weight of the base matrix or PCM should be smaller than a maximum threshold value.
2) A smallest column weight of the base matrix or PCM should be larger than a minimum threshold value.

As an option, the matrix portion A can be sparsed to reduce the complexity of decoding (or encoding). The sparsing processing can be to sparse one or several of the most dense columns, e.g., selecting the most dense column(s) of the base matrix part corresponding to A and 1) change the odd or even elements in the column to −1, or 2) change all elements in the column except index as i*3 to −1, where i=1, 2, 3 . . . . As an option, the sparse processing target can be the average column weight of the rate compatible PCM is in a reasonable range corresponding to the code rate.

Another option would be to first perform shifts/interleaving processing then sparse processing, or first sparse processing then shifts/interleaving processing.

Embodiment 2

One another embodiment can be the modification of embodiment 1, where A is generated by column cyclic shift of the data part (or sub-part, e.g., some rows) of another existing PCM for LDPC.

Embodiment 3

As another embodiment, the rate compatible PCM has several components, where the part A can be a bit-group level cyclic shift of D or a data part (or sub-part, e.g., some rows) of another existing PCM for LDPC, where the bit-group corresponds to column(s) of the existing PCM. See FIG. 5, which illustrates a structure of PCM for rate compatible QC-LDPC with inter-block cyclic shift with granularity as a bit-group. This illustrates how the part A 460 can be determined in an exemplary embodiment. Specifically, FIG. 5 illustrates the generation (as illustrated by arrow 450-2) of part A 460 based on the modification 465-2 of the cyclic shift with the level of bit-group. In comparison with FIG. 4C, in FIG. 4C, the cyclic shift value will be e.g., 2*Z, but in FIG. 5, the cyclic shift value could be any value, e.g., 5, 10, or m*Z+n, where m and n are non-negative integers. In the example of FIG. 5, the "m" out of 12*Z columns is shown, and the cyclic shift value is therefore "m".

Embodiment 4

As another exemplary embodiment, the rate compatible PCM has several components, where the part A can be an inter-block interleaving of D or a data part (or sub-part, e.g., some rows) of another existing PCM for LDPC. See FIG. 6, which illustrates a structure of PCM for rate compatible QC-LDPC with inter-block interleaving. This figure illustrates how the part A 460 can be generated (as illustrated by arrow 450-3) in an exemplary embodiment. In this example, the columns 1-12 from the data part (D) 430 are interleaved (modification 465-3) to generate the part A 460 with column 9, 10, 5, 6, 3, 4, 11, 12, 7, 8, 1, and 2 from the data part 430.

Embodiment 5

As another embodiment, the cyclic shifts can be per the component matrix or per row-group (i.e., one row or several rows) in the component matrix. For the latter, the cyclic shift value for different row-groups can be different. For instance, for a first r1 rows, the cyclic shift value is CS1=2, while for the other rows, the cyclic shift value is CS2=5. As a more specific example, cyclic shift processing can be per row-group, e.g., a cyclic shift 2 for the first Z rows, a cyclic shift 5 for a second Z rows, and the like, where Z is the expansion factor.

Figure 8:
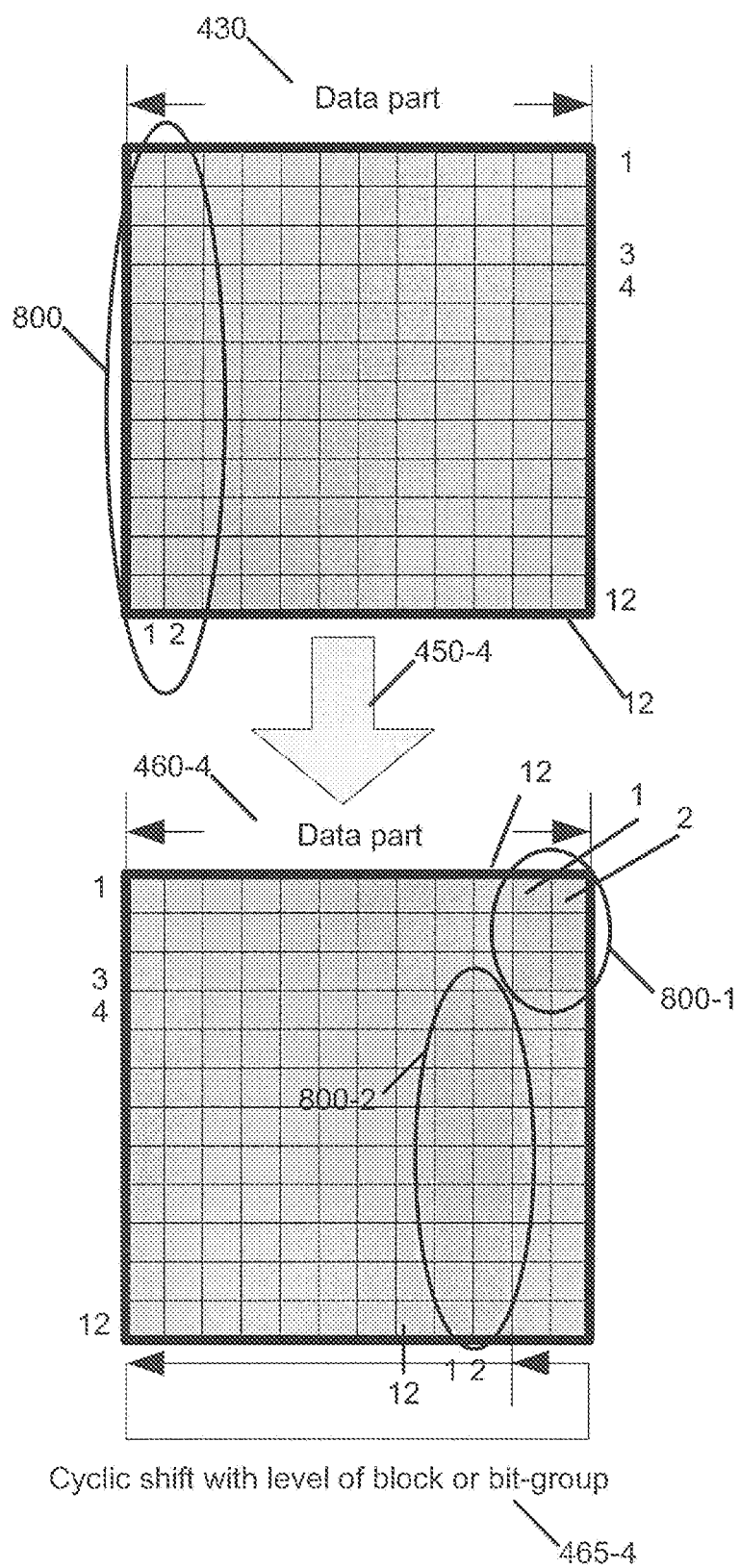
FIG. 8 illustrates a structure of PCM for rate compatible QC-LDPC with inter-block cyclic shift with granularity as block or bit-group.

Additionally, FIG. 8 illustrates a structure of PCM for rate compatible QC-LDPC with inter-block cyclic shift with granularity as block or bit-group, and this figure provides a way of visualizing one possible implementation of Embodiment 5. This figure illustrates how the part A 460 might be generated (as illustrated by arrow 450-4). For the data parts 430 and 460-4, these are 12×12 matrices in this example. The first two columns (illustrated by reference 800) from the data part (e.g., D) 430 are shifted from the first two columns to create the data part (e.g., A) 460-4 as follows. In the generation 450-4, the first three rows will be cyclic shifted by two blocks (to the left), and the other nine rows will be cyclic shifted by four blocks (to the left). So this is referred to as cyclic shift per row-group (the first three rows as a row-group and the other nine rows are another row-group). In terms of FIG. 8, the first two columns for the first three rows (rows 1-3) of the data part 430 are shifted from their original columns to columns 11 and 12 of the data part 460-4. This is illustrated by reference 800-1. The first two columns for rows 4-12 of the data part 430 are shifted from their original columns to columns 9 and 10 of the data part 460-4. This is illustrated by reference 800-2. The modification 465-4 is a cyclic shift with level of block or bit-group.

As for all the embodiments, the PCM can be as follows:

$$\begin{bmatrix} D & P_{11} & \ldots & P_{1N} \\ A_1 & P_{21} & \ldots & P_{2N} \\ \ldots & \ldots & \ldots & \ldots \\ A_M & P_{M1} & \ldots & P_{MN} \end{bmatrix},$$

where, $P_{m,n}$, m=1, . . . M, n=1, . . . N can be of any reasonable structure; any of $A_m$, m=1, . . . , M can be designed based on this disclosure.

The cyclic shift value can be found with some searching. One example can be as related in the following.

The base matrix for code rate=1/2 with Z=Z1 is [D P] as $$[D\ P] = \begin{bmatrix} P_{1,1}P_{1,2} & \ldots & P_{1,11}P_{1,12}P_{1,13}P_{1,14} & \ldots & P_{1,23}P_{1,24} \\ P_{2,1}P_{1,2} & \ldots & P_{2,11}P_{2,12}P_{2,13}P_{2,14} & \ldots & P_{2,23}P_{2,24} \\ P_{3,1}P_{3,2} & \ldots & P_{3,11}P_{3,12}P_{3,13}P_{3,14} & \ldots & P_{3,23}P_{3,24} \\ \ldots & \ldots & \ldots & \ldots & \ldots \\ P_{12,1}P_{12,2} & \ldots & P_{12,11}P_{12,12}P_{12,13}P_{12,14} & \ldots & P_{12,23}P_{12,24} \end{bmatrix},$$

where D includes the first 12 columns and P includes the last 12 columns.

The new base matrix can be as follows:

$$A = \begin{bmatrix} P_{1,cs}P_{1,cs+1} & \ldots & P_{1,11}P_{1,12}P_{1,1}P_{1,2} & \ldots & P_{1,cs-1}P_{1,cs} \\ P_{2,cs}P_{1,cs+1} & \ldots & P_{2,11}P_{2,12}P_{2,1}P_{2,2} & \ldots & P_{2,cs-1}P_{2,cs} \\ P_{3,cs}P_{3,cs+1} & \ldots & P_{3,11}P_{3,12}P_{3,1}P_{3,2} & \ldots & P_{3,cs-1}P_{3,cs} \\ \ldots & \ldots & \ldots & \ldots & \ldots \\ P_{12,cs}P_{12,cs+1} & \ldots & P_{12,11}P_{12,12}P_{12,1}P_{12,2} & \ldots & P_{12,cs-1}P_{12,cs} \end{bmatrix}.$$

where $$\begin{bmatrix} D & P & 0 \\ A & 0 & I \end{bmatrix},$$

A column cyclic shift cs for data part of D can be used to generate the new part A as follows:

$$I = \begin{bmatrix} 0 & -1 & -1 & -1 & -1 & -1 & -1 & -1 & -1 & -1 & -1 & -1 \\ -1 & 0 & -1 & -1 & -1 & -1 & -1 & -1 & -1 & -1 & -1 & -1 \\ -1 & -1 & 0 & -1 & -1 & -1 & -1 & -1 & -1 & -1 & -1 & -1 \\ -1 & -1 & -1 & 0 & -1 & -1 & -1 & -1 & -1 & -1 & -1 & -1 \\ -1 & -1 & -1 & -1 & 0 & -1 & -1 & -1 & -1 & -1 & -1 & -1 \\ -1 & -1 & -1 & -1 & -1 & 0 & -1 & -1 & -1 & -1 & -1 & -1 \\ -1 & -1 & -1 & -1 & -1 & -1 & 0 & -1 & -1 & -1 & -1 & -1 \\ -1 & -1 & -1 & -1 & -1 & -1 & -1 & 0 & -1 & -1 & -1 & -1 \\ -1 & -1 & -1 & -1 & -1 & -1 & -1 & -1 & 0 & -1 & -1 & -1 \\ -1 & -1 & -1 & -1 & -1 & -1 & -1 & -1 & -1 & 0 & -1 & -1 \\ -1 & -1 & -1 & -1 & -1 & -1 & -1 & -1 & -1 & -1 & 0 & -1 \\ -1 & -1 & -1 & -1 & -1 & -1 & -1 & -1 & -1 & -1 & -1 & 0 \end{bmatrix}.$$

As an example, if we use the data part of the base matrix for code length=1944 and code rate=1/2 as D, then cs can be 2, 5, 7 or 10 to guarantee the PCM criteria mentioned above are satisfied in the new PCM for rate compatible structure for IR HARQ.

Possible Implementations, Additional Examples, and Benefits

Figure 7:
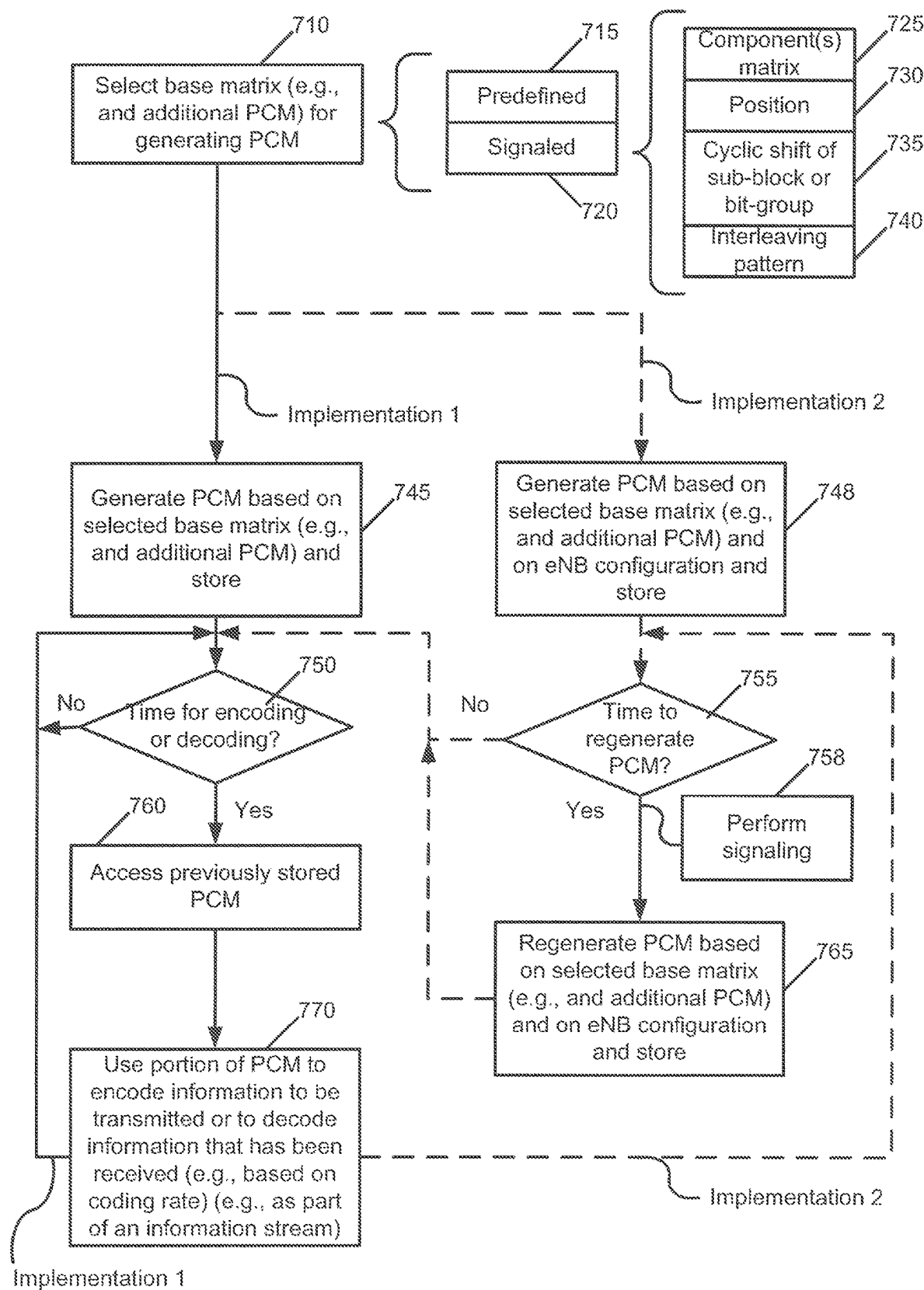
FIG. 7 is a logic flow diagram for inter-block modifications to generate sub-matrix of rate compatible parity check matrix, and illustrates the operation of an exemplary method, a result of execution of computer program instructions embodied on a computer readable memory, functions performed by logic implemented in hardware, and/or interconnected means for performing functions in accordance with exemplary embodiments.

Turning to FIG. 7, this figure is a logic flow diagram for inter-block modifications to generate sub-matrix of rate compatible parity check matrix. This figure also illustrates the operation of an exemplary method, a result of execution of computer program instructions embodied on a computer readable memory, functions performed by logic implemented in hardware, and/or interconnected means for performing functions in accordance with exemplary embodiments. The blocks in FIG. 7 may be performed by a network node such as the eNB 170, e.g., under control at least in part of the error correction module 150. The blocks in FIG. 7 may also be performed by a UE 110, e.g., under control at least in part of the error correction module 140. For instance, the eNB 170 could use the flow in FIG. 7 to encode data and transmit the data to a UE 110, which would also use the flow to decode the data after reception. Similarly, the UE 110 could use the flow in FIG. 7 to encode data and transmit the data to the eNB 170, which would also use the flow to decode the data after reception. For simplicity, it is assumed that a "device" will perform the blocks of FIG. 7.

The implementations herein may be based on a predefined PCM and/or additional PCM. Thus, in block 710, the device selects a PCM (e.g., and possibly the additional PCM used to determine the extension part) for generating a PCM, e.g., and in block 715, these are predefined. There can also be other ways to make the eNB and UE use the same additional PCM and/or selected PCM, such as performing signaling (see block 720) between eNB and UE (e.g., most probably by having the eNB configured to signal the UE), where the signaling can include signaling one or some combination of the following:

Indicator(s) for component(s) matrix (see block 725), where the component(s) matrix is the D matrix or another PCM as the additional PCM used for the extension process;

Indicator(s) for the position of the component(s) matrix (e.g., combination of position of the component matrix, e.g., D matrix and possibly another PCM as the additional PCM, and their cyclic shift value/interleaving pattern) (see block 730);

Indicator(s) for the cyclic shift value of block or bit-group (see block 735); and/or Indicator for the interleaving pattern (see block 740).

And it is also possible to predefine some parameters and transmit some parameters based on signaling between the eNB and UE, in order to enable both of these to determine the correct matrix (or matrices) to be used for the extension process and/or for the extension process to be performed correctly. For instance, it is possible in some embodiments to not use an entire PCM or additional PCM during the extension process. Instead, one may generate at least one row of the data part for the PCM, but this may be not used as a PCM. Then one may generate another row of the data part by modifying (e.g., cyclic shift and/or interleaving of the at least one row), then one may also generate a PCM for LDPC via this type of process. The parameters some or all of this process might be signaled from, e.g., the eNB to the UE.

There are at least two implementation methods, as described below. It should be noted that the techniques presented herein will generate the base matrix or PCM with expansion. This can be used for any code rate, any code length, also working with other methods to generate the base matrix or PCM, e.g., as one step in a whole generation method.

In a first implementation, the PCM (and/or additional PCM) is pre-generated according to the methods described above and stored in the eNB (and/or UE). The eNB (and/or UE) uses the generated PCM for decoding and/or encoding, where the existing PCM or additional PCM used to generate the extension part of the PCM and the cyclic shift value/interleaving pattern can be searched from any reasonable candidate set.

In a second implementation, the eNB (and/or UE) generates a PCM according to the methods described above. The eNB (and/or UE) uses the generated PCM for decoding and/or encoding, where the existing PCM used to generate the extension part and the cyclic shift value/interleaving pattern can be searched from any reasonable candidate set.

These two exemplary implementations are illustrated in FIG. 7 as follows: Implementation 1 is illustrated as having blocks 745, 750, 760, and 770; Implementation 2 is illustrated as having blocks 748, 755, and 765, in addition to blocks 750, 760, and 770.

Implementation 1 begins in block 745, where the device generates the PCM based on a selected PCM (e.g., and additional PCM) (or possibly components of a matrix) and stores the generated PCM. In the example of FIG. 4A, for instance, the PCM is the part 420 that has been extended using the part D 430 (in an example, or data part of an additional PCM in another example). In block 750, it is determined whether it is time for encoding or decoding. It if is not time (block 750=No), the flow proceeds back to block 750 to await the time for encoding or decoding. If it is time for encoding or decoding (block 750=Yes), in block 750, the device accesses the previously stored PCM and in block 770, the device uses a portion of the PCM to encode information to be transmitted or to decode information that has been received (e.g., based on coding rate). As an example, the portion 410 in FIG. 4A may be used to encode or decode information at a first (e.g., higher) coding rate, and the portion 420 may be used to encode or decode information at a second (e.g., lower) coding rate. Thus, the portion may be some or all of the PCM 420. Note that if only the part 410 will be used, only this part can be accessed if desired. In block 770, a portion of an information stream can be encoded or decoded. After block 770, the flow in Implementation 1 proceeds to block 750. It is assumed that the same PCM will be used in this implementation.

Implementation 2 begins in block 748, where the device generates the PCM based on a selected PCM (e.g., and additional PCM) (or possibly elements of a matrix) and based on eNB configuration (for instance) and stores the generated PCM. That is, in this example implementation, the eNB can change the generated PCM over time. As with block 745, the generated PCM (in the example of FIG. 4A) is the part 420 that has been extended using the part D 430 (in an example, or data part of an additional PCM in another example). In block 755, it is determined whether it is time to regenerate the PCM. It if is not time (block 755=No), the flow proceeds back to block 750 to await the time for encoding or decoding. If it is time to regenerated the PCM (block 755=Yes), in block 765, the device regenerates the PCM based on selected PCM (e.g., and additional PCM) and on eNB configuration and stores the regenerated PCM. The flow for Implementation 2 proceeds to block 750. Note also that after block 770, the flow for Implementation 2 proceeds to block 755. It is possible in block 758 to perform the signaling as in block 720.

As for all the embodiments and implementations, the rate compatible PCM can be generated by the inter-block modifications based on PCM(s) (e.g., and additional PCM(s)), or the rate compatible PCM can be generated by the inter-block modifications based on base matrix(s) (e.g., and base matrix(es) of the additional PCMs) and then expansion based on the expansion factor. As a specific example, a full part or a partial part of the data part in the parity check matrix or a corresponding base matrix may be used to form one component matrix of the PCM.

The proposed exemplary schemes provide one technique as inter-block cyclic shift and/or interleaving of the data part of some existing PCM to generate the component of rate compatible PCM to support IR HARQ, based on some existing component matrix (that can guarantee the PCM criteria mentioned above is satisfied). This scheme can guarantee the PCM criteria mentioned above is satisfied based on selection of the component matrix and cyclic shift value/interleaving with granularity as sub block or bit-group.

Comparing generating the PCM for HARQ IR with rate compatible design, this method does not need to generate a new sub-matrix for the extension part of the data part retransmission in the entire PCM by a complex method such as PEG. Instead, this method may only reuse part of some existing matrix (e.g., PCM from 802.11n, 802.16e, or any other existing PCM, etc.) as a component matrix, and select the cyclic shift value/interleaving with granularity as column(s) of the existing base matrix or PCM. The difficulty for generation of PCM for HARQ IR or rate compatible system will be reduced using this method. The overhead for storage of the PCM can also be reduced if the existing base matrix or PCM is the one already stored in the eNB/UE for the first transmission.

Additionally, based on this method, with component matrix set and combination and cyclic shift/interleaving pattern, technically many different PCM can be generated with a limited component matrix set.

As the simple process and complexity reduction described herein for generation of PCM of HARQ IR or rate compatible LDPC, this method might be more easily used.

It is further noted that the granularity is described as being "blocks" (e.g., of columns), but this terminology has been used for consistency and ease of description. The "blocks" may also be considered to be sub-blocks. For instance, in Embodiment 5, the columns are split to enable two or more portions of a single column to be shifted, and these portions might be considered to be sub-blocks. Additionally, depending on interpretation, a matrix might be a "block", and the columns could then be "sub-blocks". Furthermore, the operations above for the blocks were performed primarily for columns, but it may also be possible to perform the same operations for rows.

Additionally, the above description uses the terms "user equipment" and "base station" (or eNB). These terms are used solely for ease of description. The user equipment may be any wireless mobile device and the base station may be any wireless network access node allowing the wireless mobile device to access a wireless network. For instance, the terminology used in local area networks (LANs) (such as WI-FI, a technology that allows electronic devices to connect to a wireless LAN) is typically that a base station is referred to as an access point and the wireless mobile devices have many different names.

The following are additional exemplary embodiments in accordance with this disclosure.

Example 1

A method, comprising: accessing information; and at least one of encoding or decoding the information using a parity check matrix based on a coding rate, wherein a portion of a data part in the parity check matrix has been generated based on part or all of another matrix.

Example 2

The method of example 1, wherein the part or all of the another matrix is not a part of the parity check matrix used for the at least one of encoding or decoding.

Example 3

The method of example 2, wherein the part or all of the another matrix is part or all of one component matrix of a matrix that can be used as a different parity check matrix or the another matrix is part or all of one component matrix of a matrix that can be used as a base matrix of a different parity check matrix.

Example 4

The method of example 1, wherein the another matrix is one part of the parity check matrix used for the at least one of the encoding or decoding, different from the portion of the data part in the parity check matrix.

Example 5

The method of example 4, wherein the another matrix is one component matrix of the parity check matrix or the another matrix is one component matrix of a base matrix of the parity check matrix.

Example 6

The method of any one of examples 1 to 5, wherein the portion of the data part in the parity check matrix has been generated based on part but not all of the another matrix.

Example 7

The method of any one of examples 1 to 5, wherein the portion of the data part in the parity check matrix has been generated based on all of the another matrix.

Example 8

The method of any of examples 1 to 7, wherein the portion of the data part in the parity check matrix is used only for encoding or decoding retransmissions; and, wherein the parity check matrix is generated based on a data portion of another parity check matrix, the data portion of the another parity check matrix used at least for initial transmissions.

Example 9

The method of any one of example 1 to 8, wherein the parity check matrix is defined as the following matrix:

$$\begin{bmatrix} D & P & 0 \\ A & 0 & I \end{bmatrix},$$

where the portion of the data part is a matrix A, the another matrix is a matrix D or a different parity check matrix or a corresponding base matrix of the different parity check matrix, a matrix P is a parity part in a parity check matrix, 0 is a matrix of zeros and I is the identity matrix.

Example 10

The method of example 9, wherein the matrix A has been through a sparsing process to sparse one or several columns Example 11

The method of any one of examples 1 to 10, wherein the portion of the data part has been formed by modifications of the part or all of the another matrix.

Example 12

The method of example 11, wherein the modifications comprise one or both of cyclic shifts and interleaving of the part or all of the another matrix.

Example 13

The method of example 12, wherein cyclic shifts of the part or all of the another matrix have been performed by inter-block cyclic shifting of the part or all of the another matrix.

Example 14

The method of any one of examples 12 or 13, wherein the interleaving of the part or all of the another matrix comprises inter-block interleaving of the part or all of the another matrix.

Example 15

The method of example 11, wherein the modifications comprise cyclic shifting columns of the part or all of the another matrix, wherein cyclic shift values for different row-groups are different.

Example 16

The method of any one of examples 11 to 15, wherein the modifications comprise inter-block interleaving of the part or all of the another matrix, wherein inter-block interleaving patterns for different row-groups are different.

Example 17

The method of any one of examples 11 or 12, wherein the modifications are based on per one granularity or several granularities.

Example 18

The method of example 17, where the granularity is one of per block or per bit-group corresponding to the another matrix.

Example 19

The method of any one of examples 11 to 17, wherein the modification is based on searching per the granularity, and wherein the searching is performed to guarantee a variance of column weight of a base matrix of the parity check matrix or of the parity check matrix is not larger than a threshold.

Example 20

The method of example 19, wherein the searching is performed to guarantee a largest column weight of the base matrix or the parity check matrix is smaller than a maximum threshold value.

Example 21

The method of example 19, wherein the searching is performed to guarantee a smallest column weight of the base matrix or parity check matrix is larger than a minimum threshold value.

Example 22

The method of any one of examples 1 to 22, further comprising receiving the information as part of an information stream, and the one of encoding or decoding comprises decoding the information using the parity check matrix based on the coding rate.

Example 23

The method of any one of examples 1 to 22, wherein the information is to be transmitted as part of an information stream, the one of encoding or decoding comprises encoding the information using the parity check matrix based on the coding rate, and the method further comprises transmitting the encoded information.

Example 24

A computer program comprising program code for executing the method according to any of examples 1 to 23.

Example 25

The computer program according to example 24, wherein the computer program is a computer program product comprising a computer-readable medium bearing computer program code embodied therein for use with a computer.

Example 26

An apparatus, comprising: at least one processor; and at least one memory including computer program code, the at least one memory and the computer program code configured, with the at least one processor, to cause the apparatus to perform a method according to any of examples 1 to 23.

Example 27

A computer program product comprising a computer-readable storage medium bearing computer program code embodied therein for use with a computer, the computer program code comprising code for performing a method according to any of examples 1 to 23.

Example 28

An apparatus, comprising: means for accessing information; and means for at least one of encoding or decoding the information using a parity check matrix based on a coding rate, wherein a portion of a data part in the parity check matrix has been generated based on part or all of another matrix.

Example 29

The apparatus of example 28, further comprising means for performing any of the methods of examples 2 to 23.

Example 30

A wireless mobile device comprising the apparatus of any of examples 28 to 29.

Example 31

A wireless network access node comprising the apparatus of any of examples 28 to 29.

Example 32

A communication system, comprising at least one wireless mobile device according to example 30 and at least one wireless network access node according to example 31.

Embodiments herein may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 1. A computer-readable medium may comprise a computer-readable storage medium (e.g., memories 125, 155, 171 or other device) that may be any media or means that can contain, store, and/or transport the instructions for use by or in connection with an instruction execution system, apparatus, or device, such as a computer. A computer-readable storage medium does not comprise propagating signals.

If desired, the different functions discussed herein may be performed in a different order and/or concurrently with each other. Furthermore, if desired, one or more of the above-described functions may be optional or may be combined.

Although various aspects are set out above, other aspects comprise other combinations of features from the described embodiments, and not solely the combinations described above. For example, one skilled in the art would appreciate that also a data portion of any PCM, not merely a rate compatible PCM, can be generated in accordance with the described embodiments.

It is also noted herein that while the above describes example embodiments of the invention, these descriptions should not be viewed in a limiting sense. Rather, there are several variations and modifications which may be made without departing from the scope of the present invention.

The following abbreviations that may be found in the specification and/or the drawing figures are defined as follows:

5G fifth generation
CC chase combined
eNB (or eNodeB) evolved Node B (e.g., an LTE base station)
HARQ hybrid automatic repeat request
HARQ IR hybrid automatic repeat request incremental redundancy
I/F interface
IR incremental redundancy
LDPC low density parity check
LTE long term evolution
MME mobility management entity
NCE network control element
N/W network
PCM parity check matrix
PEG progressive-edge-growth
QC-LDPC quasi-cyclic LDPC
RRH remote radio head
Rx receiver or reception
SGW serving gateway
Tx transmitter or transmission
UE user equipment (e.g., a wireless, typically mobile device)

What is claimed is:

1. An apparatus, comprising:
at least one processor; and
at least one memory including computer program code,
the at least one memory and the computer program code configured, with the at least one processor, to cause the apparatus to:
access information; and
perform at least one of encoding or decoding of the information using a parity check matrix based on a coding rate, wherein a portion of a data part in the parity check matrix has been generated based on part or all of another matrix, and wherein the portion of the data part in the parity check matrix is sparsed.

2. The apparatus of claim 1, wherein the part or all of the another matrix is not a part of the parity check matrix used for the at least one of encoding or decoding.

3. The apparatus of claim 2, wherein the part or all of the another matrix is part or all of one component matrix of a matrix that can be used as a different parity check matrix or the another matrix is part or all of one component matrix of a matrix that can be used as a base matrix of a different parity check matrix.

4. The apparatus of claim 1, wherein the another matrix is one part of the parity check matrix used for the at least one of the encoding or decoding, different from the portion of the data part in the parity check matrix.

5. The apparatus of claim 4, wherein the another matrix is one component matrix of the parity check matrix or the another matrix is one component matrix of a base matrix of the parity check matrix.

6. The apparatus of claim 1, wherein the portion of the data part in the parity check matrix is used only for encoding or decoding retransmissions; and, wherein the parity check matrix is generated based on a data portion of another parity check matrix, the data portion of the another parity check matrix used at least for initial transmissions.

7. The apparatus of claim 1, wherein the parity check matrix is defined as the following matrix:

$$\begin{bmatrix} D & P & 0 \\ A & 0 & I \end{bmatrix},$$

where the portion of the data part is a matrix A, the another matrix is a matrix D or a different parity check matrix or a corresponding base matrix of the different parity check matrix, a matrix P is a parity part in a parity check matrix, 0 is a matrix of zeros and I is the identity matrix.

8. The apparatus of claim 1 wherein the portion of the data part has been generated by modifications of the part or all of the another matrix, and the modifications comprise one or both of cyclic shifts and interleaving of the part or all of the another matrix.

9. The apparatus of claim 8, wherein cyclic shifts of the part or all of the another matrix have been performed by inter-block cyclic shifting of the part or all of the another matrix.

10. The apparatus of claim 8, wherein the interleaving of the part or all of the another matrix comprises inter-block interleaving of the part or all of the another matrix.

11. The apparatus of claim 8, wherein the modifications comprise cyclic shifting columns of the part or all of the another matrix, wherein cyclic shift values for different row-groups are different.

12. The apparatus of claim 8, wherein the modifications comprise inter-block interleaving of the part or all of the another matrix, wherein inter-block interleaving patterns for different row-groups are different.

13. The apparatus of claim 8, wherein the modifications are based on per one granularity or several granularities.

14. The apparatus of claim 13, where the granularity is one of per block or per bit-group corresponding to the another matrix.

15. The apparatus of claim 8, wherein the modification is based on searching per the granularity, and wherein the searching is performed to guarantee a variance of column weight of a base matrix of the parity check matrix or of the parity check matrix is not larger than a threshold.

16. The apparatus of claim 15, wherein the searching is performed to guarantee a largest column weight of the base matrix or the parity check matrix is smaller than a maximum threshold value.

17. The apparatus of claim 15, wherein the searching is performed to guarantee a smallest column weight of the base matrix or parity check matrix is larger than a minimum threshold value.

18. The apparatus of claim 1, wherein the apparatus is further caused to:
receive the information as part of an information stream, and the at least one of encoding or decoding comprises decoding the information using the parity check matrix based on the coding rate.

19. The apparatus of claim 1, wherein the information is to be transmitted as part of an information stream, the at least one of encoding or decoding comprises encoding the information using the parity check matrix based on the coding rate, and
wherein the apparatus is further caused to transmit the encoded information.

20. A method, comprising:
accessing information; and
performing at least one of encoding or decoding of the information using a parity check matrix based on a coding rate, wherein a portion of a data part in the parity check matrix has been generated based on part or all of another matrix, and wherein the portion of the data part in the parity check matrix is sparsed.

* * * * *